(12) United States Patent
Hyobu

(10) Patent No.: US 7,922,000 B2
(45) Date of Patent: Apr. 12, 2011

(54) THIN PLATE CONTAINER WITH A STACK OF REMOVABLE LOADING TRAYS

(75) Inventor: Yukihiro Hyobu, Tokyo (JP)

(73) Assignee: Miraial Co., Ltd. (JP)

( * ) Notice: Subject to any disclaimer, the term of this patent is extended or adjusted under 35 U.S.C. 154(b) by 329 days.

(21) Appl. No.: 12/223,027

(22) PCT Filed: Feb. 13, 2007

(86) PCT No.: PCT/JP2007/052528
§ 371 (c)(1),
(2), (4) Date: Jul. 21, 2008

(87) PCT Pub. No.: WO2007/094324
PCT Pub. Date: Aug. 23, 2007

(65) Prior Publication Data
US 2010/0276324 A1    Nov. 4, 2010

(30) Foreign Application Priority Data
Feb. 15, 2006    (JP) ................ 2006-038445

(51) Int. Cl.
*B65D 85/30* (2006.01)
*A47G 19/08* (2006.01)
(52) U.S. Cl. .............. 206/454; 206/711; 211/41.18
(58) Field of Classification Search ........... 206/710, 206/711, 449, 454; 211/41.18
See application file for complete search history.

(56) References Cited

U.S. PATENT DOCUMENTS

| | | | | |
|---|---|---|---|---|
| 5,211,717 A | * | 5/1993 | Skoura | 206/710 |
| 6,736,268 B2 | * | 5/2004 | Nyseth et al. | 206/711 |
| 6,877,194 B2 | * | 4/2005 | Bradley et al. | 206/710 |
| 7,261,207 B2 | * | 8/2007 | Suzuki et al. | 206/711 |
| 7,316,325 B2 | * | 1/2008 | Burns et al. | 211/41.18 |

FOREIGN PATENT DOCUMENTS

| | | |
|---|---|---|
| JP | 63-276239 | 11/1988 |
| JP | 02-235349 | 9/1990 |
| JP | 09-074131 | 3/1997 |
| JP | 10-050815 | 2/1998 |
| JP | 2004-273867 | 9/2004 |

* cited by examiner

*Primary Examiner* — Bryon P Gehman
(74) *Attorney, Agent, or Firm* — Bacon & Thomas, PLLC (57) ABSTRACT

A thin plate container includes: a tray stack for holding and housing semiconductor wafers in spaces between a plurality of stacked, removable loading trays; and an external container for housing the tray stack. At opposite ends of each of the loading trays, a pair of grips for engagement by a processing arm of an external apparatus is provided. The external container includes: a container body; a lid; a sealing material provided between the lid and the container body to seal the inside; a pair of tray stack supporters for supporting the tray stack; and tray stack retainers for holding and supporting the tray stack housed in the container body from above and below.

17 Claims, 8 Drawing Sheets

THIN PLATE CONTAINER WITH A STACK OF REMOVABLE LOADING TRAYS

TECHNICAL FIELD

The present invention relates to a thin plate container for housing thin plates such as semiconductor wafers, magnetic recording medium disks, optical recording medium disks, glass substrates for liquid crystal, or film substrates for flexible display devices.

BACKGROUND ART

In recent years, a thin plate for an electronic device, such as a semiconductor wafer, has been increased in size and decreased in thickness. For this reason, the thin plate is likely to be damaged. As a container for housing such thin plate to store and carry it, a multistage type housing cassette is described in Japanese Kokai 2004-273867. The multistage type housing cassette is a cassette capable of carrying an extremely thin wafer having a thickness of 20 to 100 μm without chipping of an outer circumferential surface of the wafer and also without erroneous suction of it on a pad. This housing cassette has a plurality of housing racks arranged at equal intervals and stacked in a multistage form through a support.

However, such a multistage type housing cassette only supports a circumferential edge of the extremely thin wafer from its bottom side, but is not provided with means for securely constraining the extremely thin wafer. For this reason, if the multistage type housing cassette is tilted, the wafer may be easily displaced and damaged, so that it is necessary to carry the cassette carefully. Also, the cassette is not configured to seal its interior to isolate the wafer from the external environment. For this reason, the cassette can neither seal the wafer to isolate it from the external environment, nor securely support it.

Figure 8:
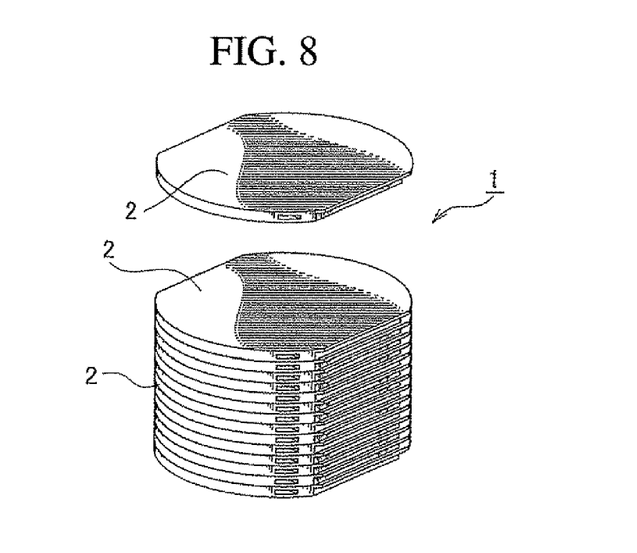
FIG. 8 is a perspective view illustrating a conventional thin plate container.

For these reasons, the present inventor has proposed a thin plate container capable of isolating thin plates, such as semiconductor wafers, from an external environment and securely supporting and carrying it. An example of the thin plate container is illustrated in FIG. 8. As illustrated in the drawings, a thin plate container 1 mainly consists of a plurality of loading trays 2. The loading trays 2 are configured to be mutually removable, and the thin plate container includes the plurality of loading trays 2, on which the thin plates are loaded, coupled with each other to form a stack.

The thin plate container 1 described as above does not have any particular problem if it is used in a factory or the like; however, if it is carried, it has problems with sealing and shock resistance.

The thin plate container 1 includes the plurality of loading trays 2 coupled with each other to form a stack, so that if it receives a shock, each of the loading trays 2 may be slightly displaced, or the seal between the respective loading trays 2 may be reduced.

SUMMARY OF THE INVENTION

The present invention is made in consideration of the above-described problems, and provides improved sealing and shock resistance which are enhanced to be able to securely house and carry the thin plates.

A thin plate container according to the present invention includes: a tray stack, having a plurality of removable loading trays stacked to couple with each other in a stack, for housing a thin plate being held in a space between the respective loading trays; and an external container for housing therein the tray stack.

Based on this configuration, the thin plate is housed in the space between the respective loading trays of the tray stack and then housed in the external container. Accordingly, the thin plate is doubly housed.

The thin plate container preferably includes a pair of grips to be gripped by a processing arm of an external apparatus provided at both opposing ends of each of the loading trays of the tray stack. The external container includes: a container body formed in a bag-like shape having an opening at one end; a lid for covering the opening of the container body; a sealing material, provided between the lid and the container body, for airtightly isolating the interior of the container body from an external environment; and a pair of tray stack supporters, respectively provided on two opposite inner surfaces of the container body, for supporting the tray stack.

Based on this configuration, the tray stack is housed in the external container with the thin plate being housed in the tray stack, supported by the pair of tray stack supporters. The external container for housing and supporting the tray stack is sealed by the sealing material.

It is preferable in the thin plate container that the tray stack seals each space, located between adjacent loading trays coupled with each other, for housing the thin plate. In this manner the thin plate is doubly sealed by the tray stack and the external container to be isolated from the external environment.

It is preferable that the tray stack includes: coupling/decoupling means adapted to independently couple/decouple between any two adjacent loading trays coupled; and a loading portion, provided on each of the loading trays, for loading the thin plate upon holding of the thin plate between two adjacent loading trays. The two adjacent are thereby coupled with each other by the coupling/decoupling means to hold the thin plate with the thin plate being loaded on the loading portion.

It is also preferable that the tray stack includes: one or a pair of base trays having a mechanical interface for fitting the tray stack to the external apparatus; one or more loading trays coupled with one surface of the base tray or inserted between the respective base trays to be coupled with each other; coupling/decoupling means adapted to independently couple/decouple adjacent loading trays or the base tray and the loading tray; and a loading portion, provided on each of the loading trays, for loading the thin plate upon holding of the thin plate between two adjacent loading trays or between the loading tray and the base tray. In this preferred embodiment, two adjacent loading trays or the loading tray and the base tray are coupled with each other by the coupling/decoupling means to hold the thin plate with the thin plate being loaded on the loading portion. The base tray is fitted to the external apparatus via the mechanical interface to support, on the external apparatus side, the tray stack including the loading tray and the base tray.

It is preferable that the thin plate be airtightly isolated from the external environment by two of the loading trays or a loading tray and the base tray being sealed with each other around the loading portion of the loading tray. This enables the thin plate to be kept clean.

It is preferable that in the thin plate container, tray stack retainers are provided for holding the tray stack housed in the container body from a bottom surface side of the container body and from the lid to support the tray stack upon fitting of the lid onto the container body. Fitting portions, fitted to the tray stack retainers, are provided at an end portion on the bottom surface of each of the loading trays of the tray stack and at an end portion on the lid side.

The tray stack retainer on the bottom surface inside the container body and that on the container body side of the lid are fitted to the fitting portions of the loading tray to support the tray stack within the external container.

Preferably, the tray stack retainers and the fitting portions have concave portions and convex portions to be fitted to each other, and abutting surfaces of the concave portions and the convex portions are sloped and wedge-like. The convex portions of the tray stack retainers and the concave portions of the fitting portions are fitted to each other, whereby the sloping surfaces of the concave portions and the convex portions are brought into abutting contact with each other. With the concave portions and the convex portions firmly coupled with each other, alignment corrections are made on the abutting wedge-like, sloping surfaces, and then the tray stack is supported by the tray stack retainers.

It is preferable in the thin plate container that a latch mechanism be provided between the container body and the lid for pressing the lid to the container body side and firmly coupling the tray stack retainers and the fitting portions with each other with the lid fitted onto the container body and the tray stack retainers and the fitting portions being fitted to each other. Because the latch mechanism presses the lid to the container body, with the tray stack retainers and the fitting portions being fitted to each other, the tray stack retainers and the fitting portions are firmly coupled with each other.

Preferably, the thin plate container that the tray stack retainers are elastic bodies which elastically support the tray stack, so that the tray stack retainers absorb external vibration and shock to prevent the vibration or the like from transmitting to the thin plate.

It is preferable that a space for inserting the processing arm of the external apparatus and a space for allowing the tray stack supported by the processing arm to be lifted are provided between the tray stack and the container body with the tray stack being supported by the tray stack supporters. This configuration allows the processing arm of the external apparatus to be inserted and coupled with the tray stack. Then, the tray stack supported by the processing arm is lifted and removed from the container body.

Preferably, the tray stack supporters are slidably or rotatably supported in the container, and spaces for inserting the processing arm of the external apparatus are provided between the spaced tray stack supporters and the tray stack. This configuration allows the processing arm of the external apparatus to be inserted between the tray stack supporters and the tray stack, and to decouple and separate any of the loading trays of the tray stack, at any position, to insert or remove the thin plate inside the loading tray. Preferably, the container body of the external container is provided with a grip to be gripped by a transfer arm of a transfer robot to lift and transfer the external container.

Preferably, the thin plate container is provided with a door guide for guiding the lid upon fitting of the lid onto the container body, and supporting the lid so as to prevent the lid from being misaligned with respect to the container body. The door guide is provided between the container body of the external container and the lid.

It is preferable that the container body of the external container be provided with a handle for lifting the external container. Because the external container is often handled with both hands, a pair of the handles is provided on the exterior of the external container. Thus, a worker holds the handles to lift and carry the external container.

It is preferable in the thin plate container that a part or a whole of the external container be formed of an ESD (electrostatic discharge) or electrically conductive material so that adherence of dust to the external container due to charging can be prevented.

Likewise, at least the loading tray of the tray stack is preferably formed of an ESD or electrically conductive material to prevent adherence of dust to the loading tray due to charging.

Further it is preferred that one or both of the tray stack and the external container be provided with a transparent window for checking the internal state through the transparent window.

DESCRIPTION OF THE PREFERRED EMBODIMENTS

An embodiment of the present invention will hereinafter be described with reference to the accompanying drawings. The thin plate container of the present invention is a container for housing thin plates for electronic devices, such as semiconductor wafers, magnetic recording medium disks, optical recording medium disks, glass substrates for liquid crystal, or film substrates for flexible display devices, to be provided for use in carrying, storage, or processing (manufacturing line, or the like). In the present embodiment, a thin plate container for housing a semiconductor wafer is described as an example. While in the following the loading tray is described as an almost circular shape, for a plate material having a rectangular shape, such as a glass substrate for liquid crystal, the loading tray would be of a rectangular shape.

Figure 1:
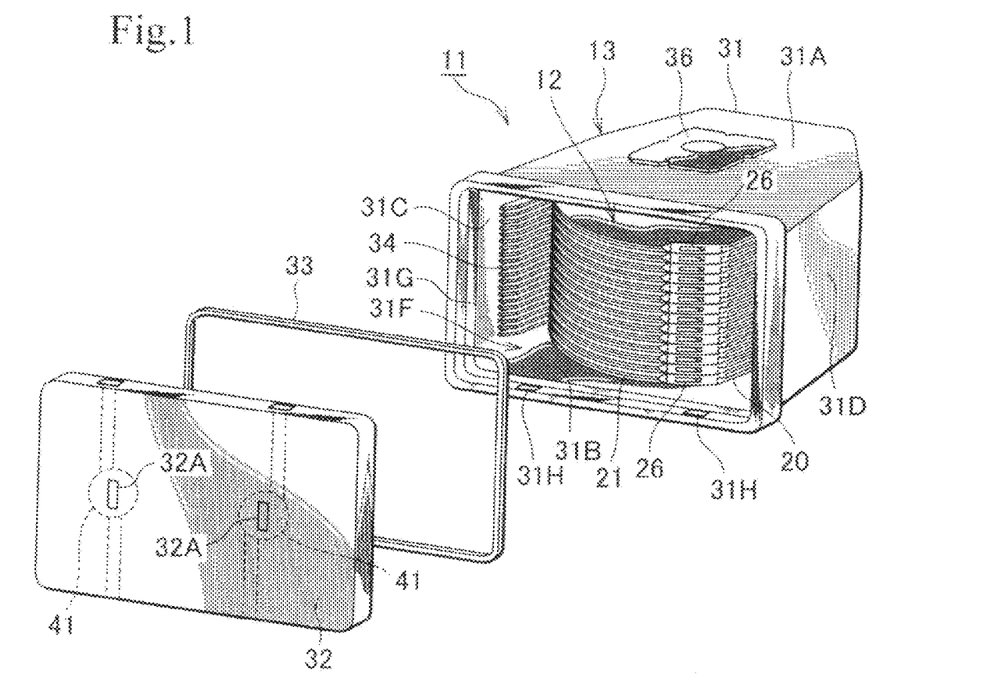
FIG. 1 is a perspective view illustrating a thin plate container according to an embodiment of the present invention.

The thin plate container 11 mainly consists of a tray stack 12 and an external container 13 as illustrated in FIG. 1.

Figure 2:
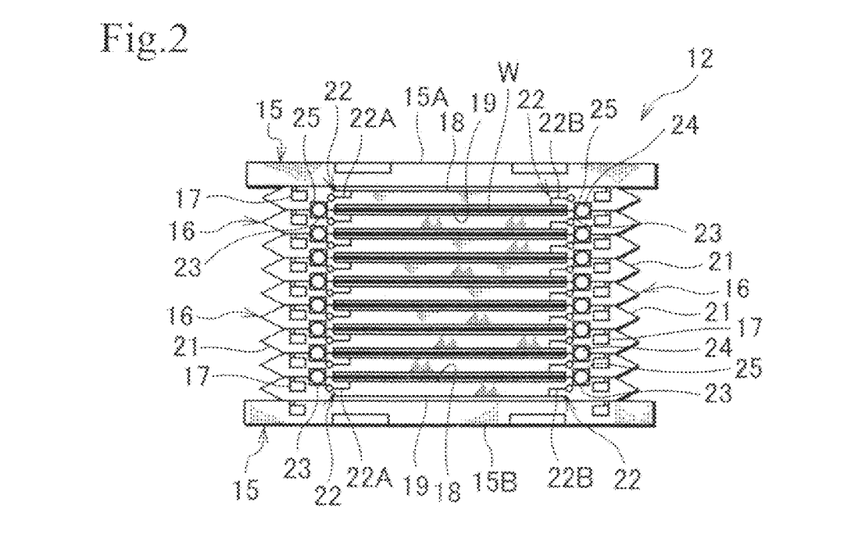
FIG. 2 is a side view illustrating a tray stack according to the embodiment of FIG. 1.
Figure 3A:
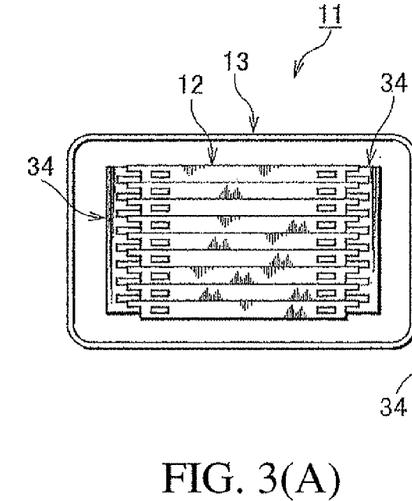
FIGS. 3(A) and 3(B) are schematic diagrams illustrating an example of tray stack supporters of the thin plate container according to the present invention.
Figure 3B:
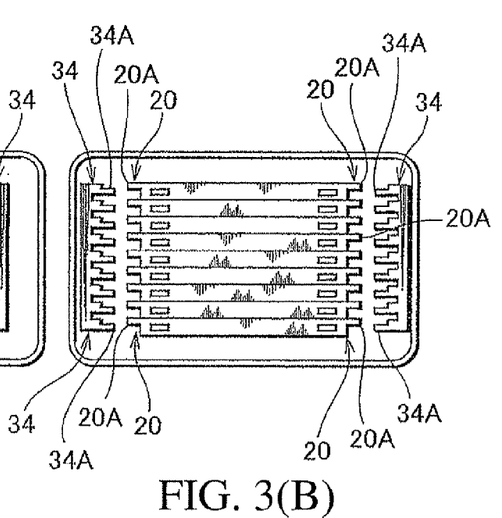

The tray stack 12 is a container for directly housing semiconductor wafers W. The tray stack 12 has a plurality of mutually removable loading trays 16 stacked to couple with each other, and is adapted to hold and house the semiconductor wafers W in respective spaces between adjacent loading trays 16. As illustrated in FIGS. 1 to 3, the tray stack 12 mainly consists of: a pair of base trays 15; one or more loading trays 16 inserted between the base trays 15; and coupling/decoupling means 17 adapted to couple/decouple the loading trays 16 or the base tray 15 and the loading tray 16. Note that FIGS. 1 and 3 omit the base trays 15 to simplify the illustration.

The base trays 15 are trays that are respectively provided above and below the one or more stacked loading trays 16 to protect upper and lower end surfaces of the loading trays, and to engage with external apparatus (not shown) for taking in/out the tray stack 12 or processing. The base tray 15 includes an upper base tray 15A and a lower base tray 15B. The respective base trays 15A and 15B are formed in an almost disk-like shape in accordance with the loading trays 16. The lower base tray 15B is, or the upper and lower base trays 15A and 15B are provided with a mechanical interface for fitting the trays to the external apparatus. The mechanical interface is coupling means or the like such as a pin groove fitted with a kinematic pin (not shown) to align the tray stack 12, or a hook hole coupled with a transfer arm on the external apparatus. The mechanical interface may have an additional function necessary for its use.

A lower side surface of the upper base tray 15A is formed similar to a second loading portion 19 on a lower side surface of the loading tray 16. An upper side surface of the lower base tray 1513 is provided with a first loading portion similar to a first loading portion 18 on an upper side surface of the loading tray 16. A seal holding groove is also provided.

Any one or both of the upper and lower base trays 15A and 1513 are provided with any one or more of a barcode, wireless tag, and InfoPad for managing information on the base trays 15.

Note that if there is only one base tray 15, the base tray 15 is fitted onto one of the surfaces of the loading tray 16, and supports the loading tray 16 from the one surface.

The loading tray 16 is a tray that is inserted between the base trays 15 and intended for housing and supporting the semiconductor wafer W. The loading tray 16 is formed in an almost disc-like shape with a grip 20 being linearly cut. Any number of the loading trays 16 may be stacked. The loading trays 16 correspond in number to number of the semiconductor wafers W which are stacked to form the tray stack 12 along with the base trays 15.

The loading tray 16 includes the first loading portion 18, the second loading portion 19, the coupling/decoupling means 17, the grip 20, a fitting portion 21, and an air intake passage 22.

The first loading portion 18 is for loading the semiconductor wafer W. The first loading portion 18 is formed on the upper side surface of the loading tray 16 as a concave depression in accordance with size and shape of the semiconductor wafer W. The semiconductor wafer W is of a circular shape, so that the first loading portion 18 is formed in a circular shape in accordance with the shape of the semiconductor wafer W.

An outer circumferential edge of the first loading portion 18 is provided with a seal holding groove 23. The seal holding groove 23 is a groove for holding a sealing material 24. The seal holding groove 23 is formed in an annular shape along an outer circumferential edge of the first loading portion 18. A housing space is formed by the first loading portion 18, the second loading portion 19, the sealing material 24, and a wall portion of a tray body. The sealing material 24 is arranged to surround the housing space formed when two of the loading trays 16 are stacked and coupled with each other. The sealing material 24 is fitted in the seal holding groove 23, and adapted to isolate the housing space from the external environment to keep it airtight. The housing space is sized to house at least one semiconductor wafer W. The housing space may simultaneously house two or more semiconductor wafers W, depending on the intended use. In such a case, the housing space is set to have a dimension corresponding to the thickness of the two or more semiconductor wafers W being stacked.

The second loading portion 19 is a portion that is fitted to the first loading portion 18 of an adjacent loading tray 16 to form the housing space isolated from an external environment, and is intended for loading and supporting the semiconductor wafer W when the semiconductor wafer W is sandwiched and turned upside down in the housing space. The second loading portion 19 houses and supports the semiconductor wafer W loaded on the first loading portion 18 in the housing space formed by covering the semiconductor wafer W from above. The second loading portion 19 is formed to have the same dimensions as the first loading portion 18.

On surfaces of the first and second loading portions 18 and 19, loading convex portions (not shown) for pressing and supporting the semiconductor wafer W housed inside from both sides are provided. The loading convex portion is formed in a web shape in order to come into contact with a minimum area of the semiconductor wafer W, to uniformly press an entire surface of the semiconductor wafer W. This allows the extremely thin semiconductor wafer W to be sandwiched and firmly supported in a housing space between the first and second loading portions 18 and 19.

An outer circumferential edge of the second loading portion 19 is provided with a seal receiving groove 25. The seal receiving groove 25 is a portion which holds the sealing material 24 in the seal holding groove 23 on the first loading portion 18 for coming into close contact to improve airtightness inside the housing space.

The coupling/decoupling means 17 is means adapted to couple/decouple any two adjacent loading trays 16. Using the coupling/decoupling means 17, any of the plurality of stacked loading trays 16 may be decoupled and opened at any position to remove the semiconductor wafer W from the loading tray 16 or to house the semiconductor wafer W in the loading tray 16 and couple the loading tray 16 with other trays. As the coupling/decoupling means 17, any known mechanism can be used. For example, it substantially consists of: a hook (not shown); a hook locking mechanism (not shown) for locking to the hook to be coupled; and a key hole 26 for inserting an operation key (not shown) for operating the hook locking mechanism to decouple the coupled hook. Note that the coupling/decoupling means 17 may be any means if it can couple/ decouple any two adjacent loading trays 16, and any known coupling/decoupling means can be used.

The keyhole 26 is for inserting the operation key for performing the removal operation of the hook locking mechanism. The removal operation hole 26 is formed to face a lateral surface of the loading tray 16. The operation key is inserted into the key hole 26 from a lateral surface of the loading tray 16 to separate the hook from an internal hook locking mechanism and to free the coupling/decoupling means 17.

Based on this, when the base trays 15 and the loading trays 16 are stacked, the coupling/decoupling means 17 couples the respective loading trays 16 to each other or to the base tray 15 to form the tray stack 12. Also, by inserting the operation key into the key hole 26 (located at any position) to free the coupling/decoupling means 17, the base tray 15 and the loading tray 16 maybe separated or recoupled.

The grip 20 is a portion fitted with and gripped by a processing arm of the external apparatus. As illustrated in FIGS. 1 and 3, the grips 20 are respectively provided at both opposing side edges (left and right side edges in FIG. 1) of the loading tray 16. The grip 20 is formed in a flanged shape in its vertical cross-section. That is, a vertical cross-section of the grip 20 includes a flange 20A protruding laterally outward from one of the side portions of the grip 20 (upper side portion in FIG. 3). The flange 20A is fitted to and supported by tray stack supporters 34.

The fitting portion 21 is fitted to a tray stack retainer 35. The fitting portions 21 are provided at end portions on bottom and lid sides of the container body 31 (end portions on both sides respectively orthogonal to the grips 20 of the loading tray 16). The fitting portion 21 has a convex or concave portion which mates with the tray stack retainer 35. Note that in the present embodiment, the fitting portion 21 is convex, whereas the tray stack retainer 35 has mating concave portions. However, this relationship may be reversed. That is, the fitting portion 21 may be the concave portion, whereas the tray stack retainer 35 may have the convex portions.

The convex fitting portion 21 has an arc-like circumferential edge which, in cross-section, is sloped and wedge-shaped. Thus, the fitting portion 21 comes into sliding contact with the sloping surface of the convex portion of the tray stack retainer 35 is firmly coupled with the tray stack retainer 35, and is thereby aligned in one direction (vertically in FIG. 1). Also, the fitting portion 21 is bent in an arc-like and convex shape, and coupled with the tray stack retainer 35 bent in an arc-like and concave shape, to thereby make alignment in the other direction (laterally in FIG. 1). Based on this, the tray stack 12 is adapted to be stably supported at a predetermined position by the two tray stack retainers 35 within the external container 13.

The air intake passage 22 is a passage for evacuating air from inside the housing space in which the semiconductor wafer W is housed. The air intake passage 22 substantially consists of a first air intake passage 22A and a second air intake passage 22B. The first air intake passage 22A provides communication between the first loading portion 18 of the loading tray 16 and the external environment. The second air intake passage 22B provides communication between the second loading portion 19 of the loading tray 16 and the external environment. Each of the air intake passages 22 is connected to a suction tube (not shown) of an external suction device (not shown) to evacuate the air from inside the housing space.

The air intake passage 22 is fitted with a filter and a cap as necessary. The filter serves to keep the inside of the housing space clean. As the filter, a filter having performance depending on a use mode is used. The cap serves to seal the inside of the housing space, to keep the inside clean or to keep the inside in a negative pressure state.

The loading tray 16 is formed of a static-free or electrically conductive polymer material or an electrically conductive material. Also, as necessary, the loading tray 16 is formed of a transparent polymer material so that the first and second loading portions 18 and 19 of the loading tray 16 are visible from the outside.

Suitable materials for the loading tray 16 include thermoplastic polymers such as polycarbonate based resins, polybutylene terephthalate based resins, polymethyl methacrylate based resins, cycloolefin based resins, polypropylene based resins, and fluorine-containing polymer based resins. By mixing, into such polymer material, an electrically conductive material such as carbon fiber or metal powder, a surfactant, or the like, electrically conductivity and static-free state can be provided.

Transparent-materials include polycarbonate based resins, polymethyl methacrylate based resins, cycloolefin based resins, and polyethylene based resins.

The loading tray 16 is provided with the wireless tag (not shown). The wireless tag is recorded with management information for the loading tray 16 or for the housed semiconductor wafer W, or both pieces of information. The wireless tag may be a read-only tag or readable/writable tag. The position of the wireless tag may be on an upper surface, a lateral surface, or lower surface of the loading tray 16, provided that it is positioned to be capable of transmitting/receiving the information to/from an external device for reading/writing the information from/in the wireless tag. Note that a barcode or InfoPad recorded with the same information may be provided, instead of the wireless tag. Alternatively, part or all of them may be provided.

The external container 13 is a container for housing therein the tray stack 12. The external container 13 substantially consists of a container body 31 formed in a bag-like shape having an opening 31F at one end; a lid 32 for covering the opening 31F of the container body 31; a sealing material 33 that is provided between the lid 32 and the container body 31 and is intended for airtightly isolating the interior of the container body 31 from the external environment; a pair of the tray stack supporters 34 that are respectively provided on two opposite inner surfaces of the container body 31, and intended for gripping the grips 20 of all or part of the loading trays 16 of the tray stack 12 to support the tray stack 12; the tray stack retainers 35 for holding and supporting the tray stack 12 from a bottom surface side of the container body 31 and from the lid 32; a grip 36 gripped by a transfer arm of a transfer robot (not shown) in a factory to lift the external container 13; and a handle (not shown) gripped by a worker's hand to lift the external container 13.

The container body 31 is formed in an almost cubic shape as a whole. The container body 31 substantially consists of four sidewalls 31A, 31B, 31C, and 31D, and a bottom plate 31E, and is provided with the opening 31F at an upper portion thereof. The container body 31 is installed sideways so as to face to a wafer transfer device (not shown) in a manufacturing line for the semiconductor wafers W, or the like. An outer side of the sidewall 31B, which corresponds to the bottom in the sideways state (state illustrated in FIG. 1), is provided with alignment means (not shown) such as a grove in which the kinematic pin is to be fitted.

At end portions (corresponding to the opening 31F portion) of the respective sidewalls 31A, 31B, 31C, and 31D of the container body 31, a lid receiving portion 31G in which the lid 32 is to be fitted is provided. At four corners of the lid receiving portion 31G, fitted portions 31H are provided, which are concave portions fitted with a latch mechanism 41 of the lid 32 to retain the lid 32 on the container body 31.

Figure 5A:
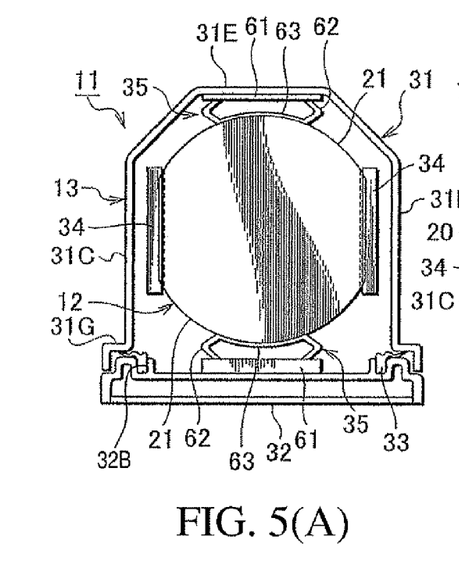
FIGS. 5(A) and 5(B) are schematic cross-sectional diagrams illustrating an example of the tray stack supporters of the thin plate container according to the present invention.
Figure 5B:
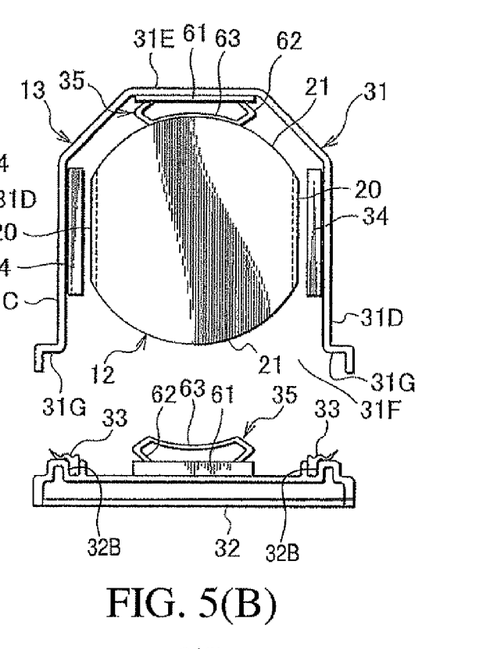

The lid 32 is a member for covering the opening 31F of the container body 31. The lid 32 is formed in an almost flat plate shape as illustrated in FIGS. 1 and 5, and fitted to the lid receiving portion 31G of the container body 31. Between the lid 32 and the container body 31 is provided the latch mechanism 41 for retaining the lid 32. On an outer surface of the lid 32, two key holes 32A for inserting keys (not shown) for operating the latch mechanism 41 are provided.

Figure 13:
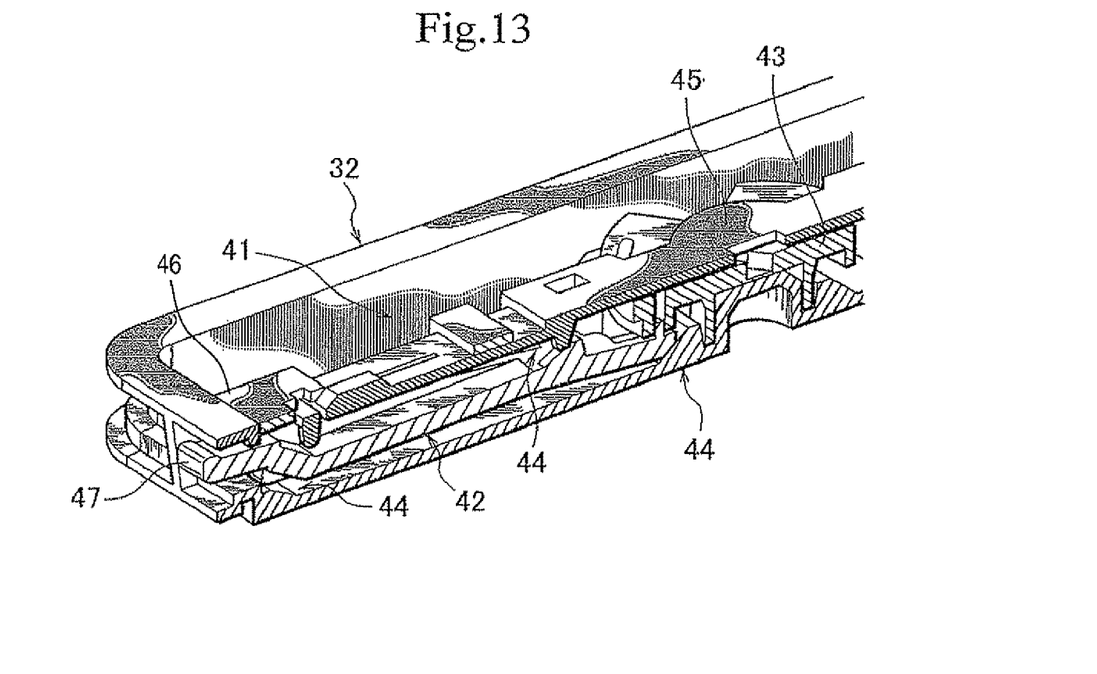
FIG. 13 is a perspective view illustrating an example of a latch mechanism of the thin plate container according to the present invention.

The latch mechanism 41 is a mechanism for pressing and holding the lid 32 on the container body 31 and firmly coupling the tray stack retainer 35 and the fitting portion 21 with each other, with the lid 32 being fitted on the container body 31 and the tray stack retainer 35 and the fitting portion 21 being mated with each other. As illustrated in FIG. 13, the latch mechanism 41 mainly consists of a locking member 42, a feeding member 43, a cam mechanism 44, a holding cover 45, and a cover retainer 46.

The locking member 42 is a member projected to the container body 31 and received in the slot 31H of the lid receiving portion 31G of the container body 31, with the lid 32 being fitted to the lid receiving portion 31G.

The feeding member 43 is connected to the locking member 42 to move the locking member 42 between extended and retracted positions. The feeding member 43 is rotatably fitted within the lid 32.

The cam mechanism 44 causes the locking number 42 to come into abutting contact with an upper surface of the slot 31H to press the lid 32 down on the container body 31. A tip fitting 47 of the locking member 42 is received in the slot 31H of the lid receiving portion 31G.

The holding cover 45 holds the locking member 42 and the feeding member 43. The cover retainer 46 retains the holding cover 45 on the lid 32.

Operation of the cam mechanism 44 raises the tip fitting portion 47 of the locking member 42, through the feeding member 43, to bring it into abutting contact with an upper surface of the slot 31H, while pressing down a base end portion to thereby force the lid 32 against, the container body 31 with leverage. In this manner, the tray stack retainer 35 and the fitting portion 21 become firmly coupled with each other.

Sealing material 33 is provided between the lid 32 and the container body 31. The sealing material 33 is, as specifically illustrated in FIG. 5, airtightly isolates the interior of the container body 31 from the external environment. The sealing material 33 is fitted into and supported by a fitting groove 32B provided on an inner surface of the lid 32 for abutting contact with the lid receiving portion 31G of the container body 31 around its entire circumference to seal the interior of the container body 31.

The tray stack supporters 34 serve to support the tray stack 12. The tray stack supporters 34 are, as illustrated in FIGS. 1 and 3, respectively provided on two opposing inner surfaces of the container body 31, and engage the grips 20 of all or portion of the loading trays 16 of the tray stack 12 to support the tray stack 12. The tray stack supporters 34 are formed in a nearly flat shape. Specifically, the tray stack supporters 34 include a flat plate-like base plate with a large number of lower side flanges for supporting the flanges 20A of the grips 20, engaging the bottom surfaces of flanges 20A. The tray stack supporters 34 are slidably fitted in the sidewalls 31C and 31D of the container body 31. Specifically, the two tray stack supporters 34 are mounted so as to be able to slide from a position close to each other with the lower side flanges 34A fitted to the flanges 20A of the grips 20 to support the tray stack 20 as illustrated in FIG. 3 (A) to a position separated from each other with the lower side flanges 34 separated from the flanges 20A of the grips 20 as illustrated in FIG. 3 (B). The number of the lower side flanges 34A is only that required to support the tray stack 12, but not necessarily that required to engaged by all of the flanges 20A of the grips 20.

Between the tray stack 12 and the container body 31 (between the tray stack 12 and the container body 31 in a vertical orientation as shown in FIG. 1), in a state where the tray stack 12 is housed in the container body 31 and supported by the tray stack supporters 34, is provided a space for inserting the processing arm of the external apparatus, and a space for allowing the tray stack 12 supported by the processing arm to be lifted. These spaces allow, the processing arm of the external apparatus to be inserted into the space, to be coupled with the tray stack 12, and to lift and remove the tray stack 12.

Also, between the tray stack supporters 34 and the tray stack 12 in a state where the tray stack supporters 34 are separated, there are provided spaces for inserting the processing arm of the external apparatus. These spaces allow the processing arm of the external apparatus to be inserted between the tray stack supporters and the tray stack 12 to decouple and separate any of the loading trays 16 of the tray stack 12 at any position. A thin plate on the tray 16 may then be removed, with the tray stack supporters 34 being separated.

Figure 4A:
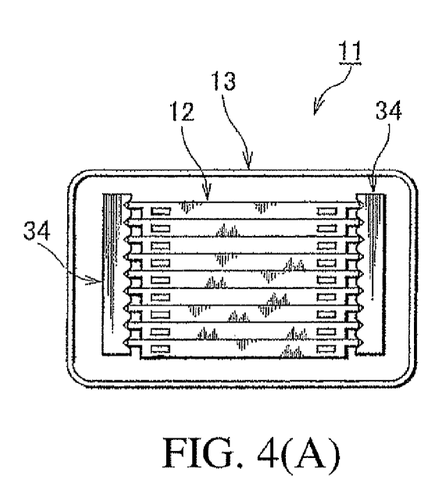
FIGS. 4(A) and 4(B) are schematic diagrams illustrating another example of the tray stack supporters of the thin plate container according to the present invention.
Figure 4B:
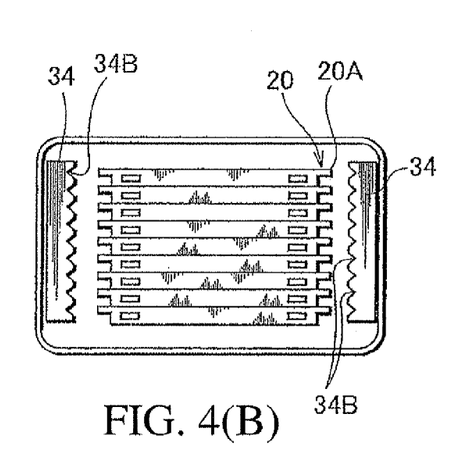
Figure 6A:
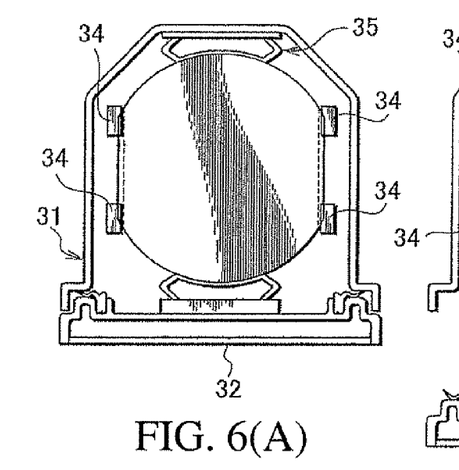
FIGS. 6(A), 6(B) and 6(C) are schematic cross-sectional diagrams illustrating another example of the tray stack supporters of the thin plate container according to the present invention.
Figure 6B:
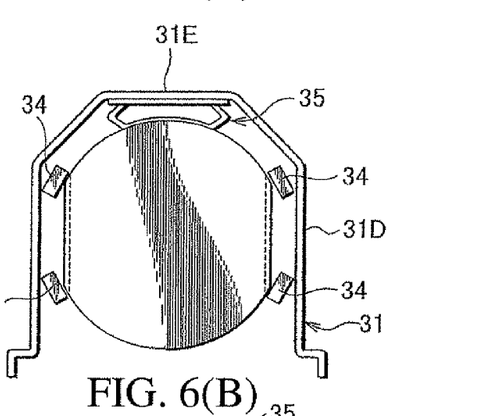
Figure 6C:
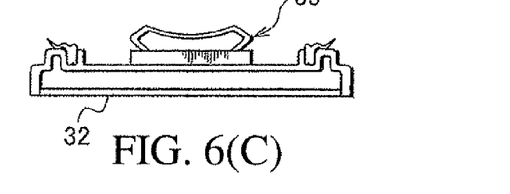

Another embodiment of the tray stack supporters 34 is illustrated in FIG. 4. The tray stack supporters 34 include V-grooves 34B fitted to the flanges 20A of the grips 20, instead of the lower side flanges 34A, as in the previously described embodiment. Still another embodiment is illustrated in FIG. 6 wherein the tray stack supporters 34 substantially consist of four rectangular rod-like bodies, instead of the two flat plate-like bodies. The tray stack supporters 34 including the four rectangular rod-like bodies are rotatably supported, and are adapted to support the tray stack 12 as illustrated in FIG. 6 (A), and rotate to the positions illustrated in FIG. 6(B) to decouple the support for the tray stack 12. The tray stack supporters 34 may have any structure which enables the tray stack supporters 34 to be fitted to the flanges 20A of the grips 20 and thereby support the tray stack 12.

Figure 9:
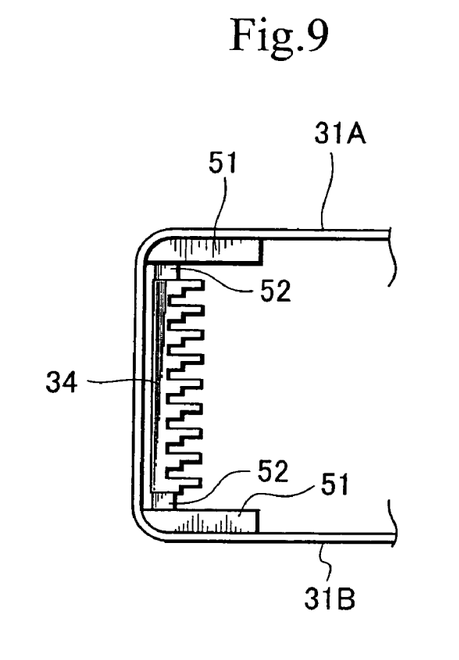
FIG. 9 is a schematic diagram illustrating a slide mechanism of the tray stack supporters of the thin plate container according to the present invention.

A conventional slide mechanism may be used for sliding support of the tray stack supporters 34. For example, as illustrated in FIG. 9, the slide mechanism may include guide rails 51 and sliders 52. The guide rails 51 are attached to the sidewalls 31A and 31B of the container body 31. The sliders 52 are slidably supported by the guide rails 51, and constrained to end portions of the tray stack supporters 34. Based on such configuration, the respective tray stack supporters 34 are supported by the guide rails 51 and the sliders 52, and either brought close or separated from each other.

Figure 10:
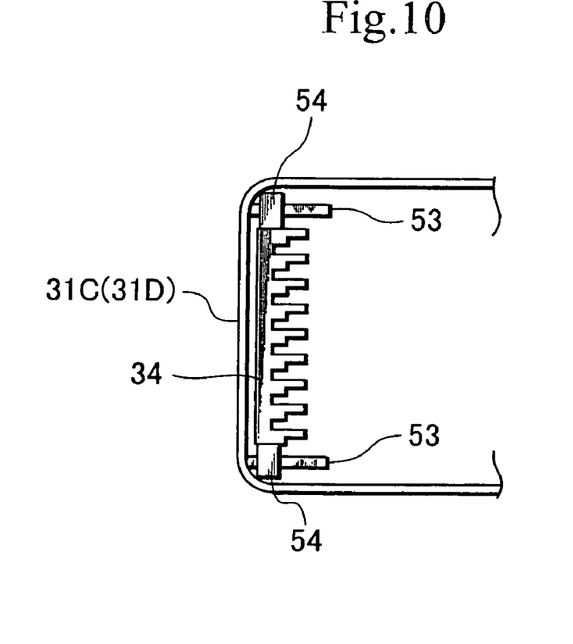
FIG. 10 is a schematic diagram illustrating another example of the slide mechanism of the tray stack supporters of the thin plate container according to the present invention.

Also, as illustrated in FIG. 10, the slide mechanism may include guide supports 53 and sliders 54. The guide supports 53 are rotatably attached to the sidewalls 31C and 31D of the container body 31. Outer circumferential surfaces of the guide supports 53 are provided with screw threads. The sliders 54 are screwed onto the guide supports 53 and thereby slidably supported and constrained to end portions of the tray stack supporters 34. The respective tray stack supporters 34, supported by the sliders 54, may be brought close or separated by rotating the respective guide supports 53.

The tray stack retainers 35, hold and support the tray stack 12 therebetween. The tray stack retainers 35 are, as illustrated in FIG. 5, provided on a bottom surface inside the container body 31 of the external container 13 and on a surface of the lid 32, respectively. The tray stack retainers 35 hold and support the tray stack 12 housed in the container body 31 from above and below when the lid 32 is fitted onto the container body 31.

Figure 11:
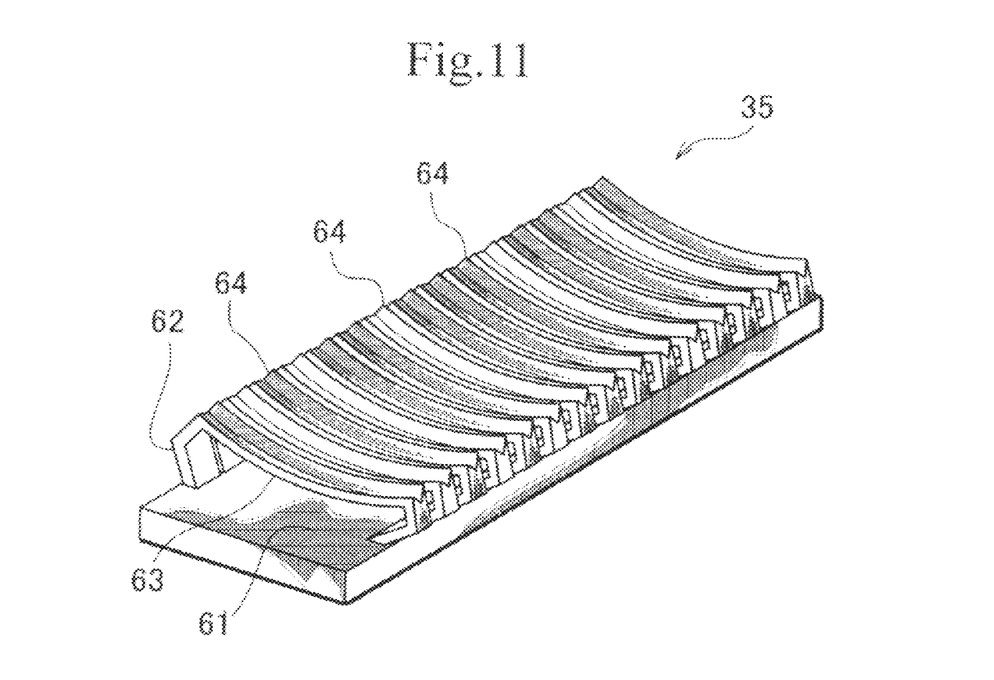
FIG. 11 is a perspective view illustrating a tray stack retainer of the thin plate container according to the present invention.
Figure 12:
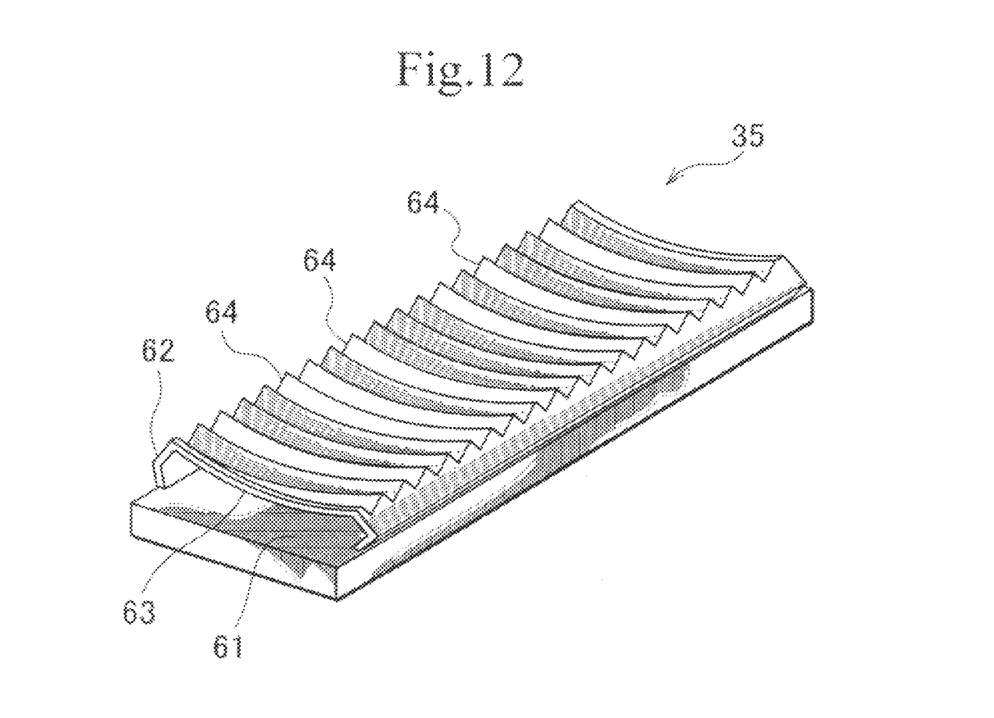
FIG. 12 is a perspective view illustrating another example of the tray stack retainer of the thin plate container according to the present invention.

The tray stack retainer 35 substantially consists of a base plate 61, an elastic support 62, and a curved fitting portion 63, as illustrated in FIGS. 5 and 11. The base plate 61 is for supporting the elastic support 62 and the curved fitting portion 63. Respective base plates 61 are directly fitted onto the bottom surface inside the container body 31 and the surface of the lid 32. The elastic support 62 is formed by being folded in a pantograph shape, and elastically supports the curved fitting portion 63. The curved fitting portion 63 is concavely curved so as to mate with the fitting portions 21 of the tray stack 12. Cross-sectionally V-shaped grooves 64, that mate with the wedge-shaped convex fitting portions 21 are formed on the curved fitting portion 63. Thus, each of abutting surfaces of the fitting portions 21 and the V-grooves 64 is formed so as to slope wedgewise. The fitting portions 21 and the V-grooves 64 are engaged firmly to each other with sliding, and thereby support vertically and laterally aligned by the curved and sloping surfaces. The number of the V-grooves 64 may be the same as, more than, or less than the number of fitting portions 21 of the tray stack 12. The V-grooves 64 of a number sufficient to firmly support the tray stack 12 are required. Note that the present embodiment includes the elastic support 62 and the curved fitting portion 63 formed as a band-like member, and a predetermined number of the members integrally provided on the base plate 61; however, they may be formed plate-like as illustrated in FIG. 12.

The V-grooves 64 of the curved fitting portions 63 of the two tray stack retainers 35 on the bottom surface inside the container body 31 and on the lid 32 are respectively mated with the fitting portions 21 of the tray stack 12 to thereby elastically support the tray stack 12, while longitudinally, laterally and vertically aligning the tray stack 12 with respect to the external container 13. The elastic support 62 is formed of a material such as a synthetic resin having elasticity. The curved fitting portion 63 is preferably molded from a material such as a hard synthetic resin so as to firmly fit and hold the respective fitting portions 21 of the tray stack 12. The base plate 61 is only required to be made of a material capable of supporting the elastic support 62 and the curved fitting portion 63. The elastic support 62 and the curved fitting portion 63 may be adapted to be firmly supported by a hard synthetic resin or the like. If the thin plate container 11 is frequently vibrated or shocked during transfer thereof, the elastic support 62, curved fitting portion 63 etc., are made elastic to elastically support the tray stack 12, and to thereby absorb the external vibration or the like. If subject to less vibration, the elastic support 62, the curved fitting portion 63 etc., are formed of a hard material to firmly support the tray stack 12.

Figure 14:
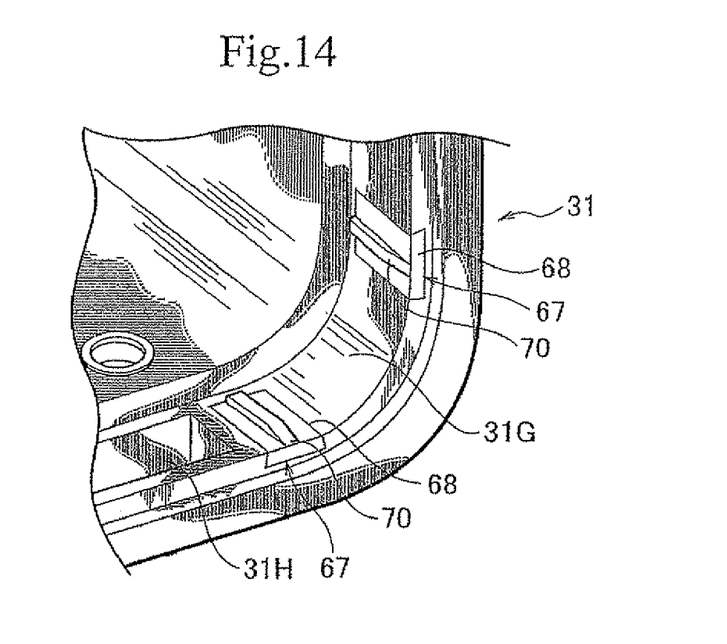
FIG. 14 is a perspective view illustrating door guides located on the container body of the thin plate container according to the present invention.
Figure 15:
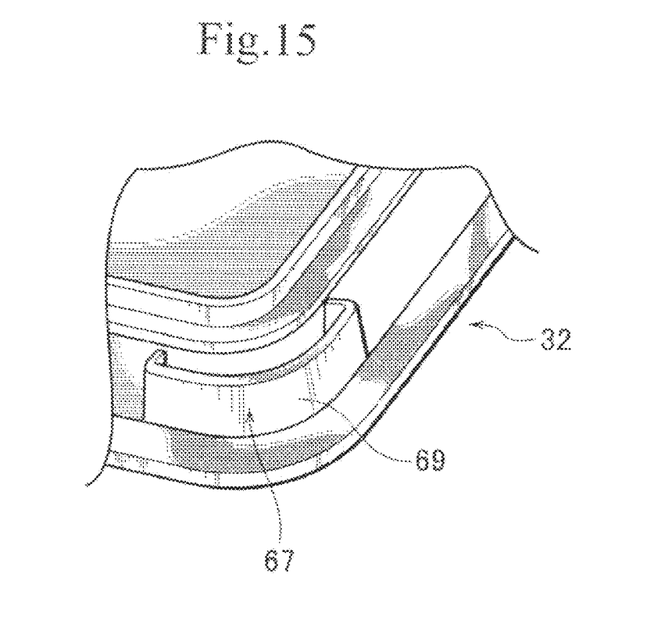
FIG. 15 is a perspective view illustrating the door guide located on a lid of the thin plate container according to the present invention.

As illustrated in FIGS. 14 and 15, between the container body 31 of the external container 13 and the lid 32 are provided door guides 67 for guiding the lid 32 when the lid 32 is fitted onto the container body 31, and for supporting the lid 32 to prevent the lid 32 from being misaligned with respect to the container body 31. The door guide 67 substantially consists of a body insert body insert 68 and a lid insert 69.

A body insert 68 is provided on each of four sides of the lid receiving portion 31G of the container body 31 to support the lid 32. Note that the body insert 68 is provided on at least the one of the four sides of the lid receiving portion 31G, which is the lower side when the container body 31 is turned sideways.

The body insert 68 is formed in a wedge-like shape. In the center on an upper side of the body insert 68, is provided a protrusion 70 which extends the length of the body insert 68. The protrusion 70 on the container body abuts and supports the lid insert 69.

The lid insert 69 comes into abutting contact with the protrusions 70 to support the lid 32. The lid inserts 69 are provided at the four corners of the circumferential edge of the lid 32 and are positioned for engagement by respective container inserts 68. The lid insert 69 is formed in a curved shape so as to cover the corner of the lid 32.

Note that the door guide 67 may be provided either with the body insert 68 or the lid insert 69.

The external container 13 is partially or wholly formed of an ESD or an electrically conductive material. Also, the external container may have a transparent window for checking the internal tray stack 12. The transparent window may be provided at a position aligned with that of a transparent window of the loading tray 16 of the tray stack 12. The transparent window of the external container 13 can be used to check whether or not there is a tray stack 12 in the external container 13, and also the semiconductor wafer W can be checked through the transparent window of the external container 13 and that of the loading tray 16.

On an outer side of the sidewall 31A, corresponding to a ceiling portion of the container body 31 turned sideways, the grip mechanism 36 is removably fitted as illustrated in FIG. 1. The container body 31 of the external container is gripped by the transfer arm of the transfer robot for transfer to a predetermined position.

On outer sides of the sidewalls 31C and 31D, corresponding to lateral wall portions of the container body 31 being turned sideways, carrying handles (not shown) are removably fitted so that a worker may grip the handles to lift the external container. Depending on the intended use, the handles are provided or not provided appropriately. Alternatively, the handles and/or grip mechanism 36 may be made integral with the external container 13.

The thin plate container 11 configured as described above is used in the following manner.

The loading trays 16, of a number which corresponds to that of the semiconductor wafers W to be held, are first stacked. On the first loading portion 18 of each of the loading trays 16, each of the semiconductor wafers W is loaded, and various pieces of information on each of the loading trays 16 and the corresponding semiconductor wafer W are recorded in the associated wireless tag. The loading trays 16 and the like are stacked and coupled with each other by the coupling/decoupling means 17 to form the tray stack 12.

The tray stack 12 is inserted into the container body 31 of the external container 13, and supported from both sides thereof by the tray stack supporters 34. Also, the lid receiving portion 31G of the container body 31 is fitted with the lid 32 automatically or manually, and the latch mechanism 41 holds the lid 32 to the container body 31. In this manner, the two tray stack retainers 35 are fitted onto the fitting portions 21 of the tray stack 12 to accurately align the tray stack 12 longitudinally, laterally, and vertically in the container body 31 and to support it. At this time, the tray stack 12 is kept in a slightly floating state with respect to the tray stack supporters 34. This makes the contact area small to thereby suppress dust generation due to friction. In addition, the flanges 20A of the grips 20 are brought into contact with and supported by the tray stack supporters 34 with the tray stack 12 being supported by the two tray stack retainers 35. If the support is to prevent external vibration or shock, the floating state should be provided. If firm support is needed, a state of contact should be provided.

In addition, when the tray stack 12 is housed in the external container 13, the base tray 15 is not necessarily present. To support upon taking in and taking out, only the lower base tray 15 need be provided.

Figure 7A:
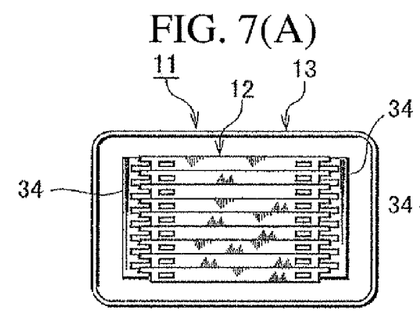
FIGS. 7(A), 7(B), 7(C) and 7(D) are schematic diagrams illustrating an operation of taking in/out the tray.
Figure 7B:
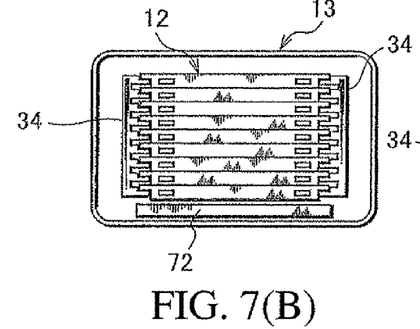
Figure 7C:
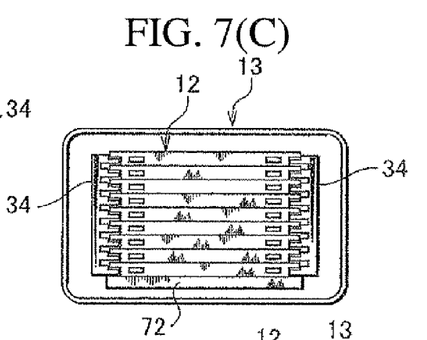
Figure 7D:
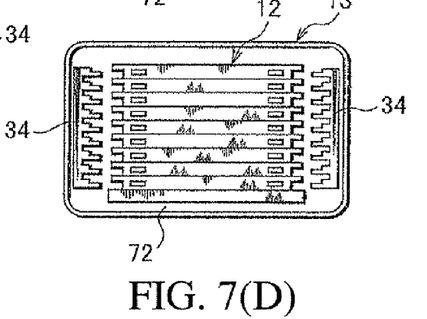

In such state, the thin plate container 11 is delivered to a factory or the like. The thin plate container 11 can be loaded facing in any direction, such as sideways or lengthways. A plurality of the thin plate containers 11 may be stacked. In the factory or the like, the semiconductor wafers W are removed from the thin plate container 11, taking the tray stack 12 from the external container 13 by inserting the transfer arm 72 as illustrated in FIG. 7(A), FIG. 7(B), and FIG. 7(C). The coupling of the tray stack 12 to the transfer arm 72 is illustrated in FIG. 7(C). In this state, the tray stack supporters 34 are separated as illustrated in FIG. 7(D), in a waiting state. Then, the transfer arm 72 is pulled to remove the tray stack 12. After removing the tray stack 12, any of the loading trays 16 may be separated at any position and the semiconductor wafer W removed from the loading tray 16.

Figure 16:
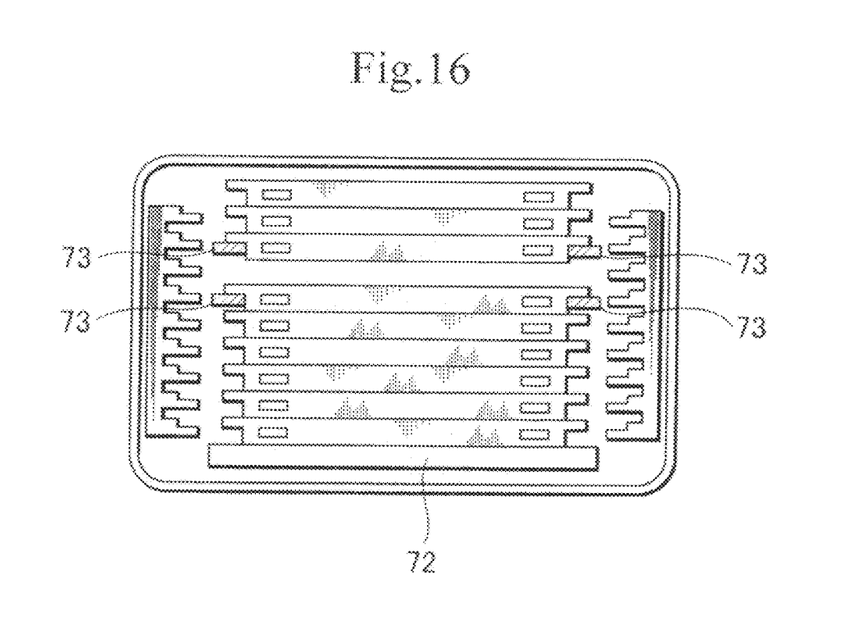
FIG. 16 is a schematic diagram illustrating an example of taking in/out a semiconductor wafer W in the thin plate container according to The present invention.

If the tray stack 12 is opened inside the container body 31 of the external container 13, opening/closing arms 73 are inserted with the tray stack 12 being supported by the transfer arm 72 as illustrated in FIG. 16; then the operation key is inserted into the key hole 26 to separate any of the loading trays 16 of the tray stack 12 at any position; and a semiconductor wafer W may be removed from any tray 16. After the semiconductor wafer W has been returned following completion of processing, the opened loading tray 16 is closed and coupled with adjacent trays by the coupling/decoupling means 17.

In addition the semiconductor wafer W may be removed or inserted together with the loading tray 16, rather than removing or inserting only the semiconductor wafer W.

The thin plate container 11 provides the following advantages.

The semiconductor wafers W are housed in the respective spaces between adjacent loading trays 16 and further housed in the external container 13, i.e., the semiconductor wafers W are housed within a double housing structure, whereby the semiconductor wafers W are securely and firmly housed and supported.

The tray stack 12 for housing the semiconductor wafers W is housed in the external container 13, and the grips 20 of the loading trays 16 are gripped by the pair of tray stack supporters 34, so that the tray stack 12 housed in the external container 13 is firmly supported while being longitudinally, laterally, and vertically aligned. As a result, the semiconductor wafers W can be securely and firmly supported with the tray stack supporters 34 absorbing external vibration or shock. Further, the interior of the external container 13 is sealed by the sealing material 33, and thereby kept clean.

The spaces that are located between adjacent loading trays 16, coupled with each other in the tray stack 12 provide an airtight inner housing for the semiconductor wafers W and are airtightly retained in the external container 13, and thereby doubly sealed, whereby sealing is significantly improved. As a result, even if the seal of the external container 13 is lost, the semiconductor wafers W can be kept clean.

Any two adjacent loading trays 16 may be coupled with each other by the coupling/decoupling means 17 with the semiconductor wafers W being held on the loading portions 18, so that any of the plurality of stacked loading trays 16 can be decoupled at any position by the coupling/decoupling means 17 to insert and remove the semiconductor wafers W, thereby facilitating the work of inserting and removing the semiconductor wafers W.

Any two adjacent loading trays 16, or the loading tray 16 and the base tray 15 are coupled with each other by the coupling/decoupling means 17 to hold the semiconductor wafers W on the loading portions 18, so that any of the plurality of stacked loading trays 16 coupled with the base tray 15 can be decoupled at any position by the coupling/decoupling means 17 to insert and remove the semiconductor wafer W. Also, in the tray stack 12 including the loading trays 16 and the base trays 15, the base trays 15 are engaged by the external apparatus via the mechanical interface to support the tray stack 12 on the external apparatus, so that the tray stack 12 can be easily and surely transferred to and from the external apparatus.

The sealing material 24 is provided around the loading portion 18 of the loading tray 16, and the semiconductor wafer W housed on the loading portion 18 is thereby airtightly isolated from the external environment when two of the loading trays 16 or a loading tray 16 and a base tray 15 are coupled with each other, so that the semiconductor wafers W can be kept clean. Also, the semiconductor wafers W become doubly sealed by the seal of the external container 13. As a result, even if any one of the seals is lost, the other seal can keep the semiconductor wafers W clean.

The tray stack retainer 35 on the bottom surface inside the container body 31 and that on the lid 32 receive the fitting portions 21 of the respective loading trays 16 to support the tray stack 12 inserted into the container body 31 of the external container 13, so that the tray stack 12 is stably and firmly supported inside the external container 13.

The abutting surfaces of the concave and convex portions of the tray stack retainers 35 and fitting portions 21 slope to form a wedge-shape, and the concave and convex portions are fitted to each other and firmly coupled, whereby alignment corrections are made on the abutting surfaces, and the tray stack 12 is stably supported and correctly positioned in the external container 13.

The latch mechanism 41 presses and holds the lid 32 against the container body 31, and firmly couples the tray stack retainers 35 and the fitting portions 21 with each other, with the lid 32 being fitted onto the container body 31 and the tray stack retainers 35 and the fitting portions 21 being fitted to each other, so that the tray stack 12 is stably supported in the correct position in the external container 13.

The space for inserting the processing arm of the external apparatus, and that for allowing the tray stack supported by the processing arm to be lifted are provided between the tray stack 12 and the container body 31, with the tray stack 12 being housed in the container body 31 and supported by the tray stack supporters 34, and, therefore, insertion and removal of the tray stack 12 is easily automated. As a result, the thin plate container can be used in an automatically controlled manufacturing line.

The processing arm of the external apparatus is inserted between the tray stack supporters 34 and the tray stack 12, and any one of the loading trays 16 of the tray stack 12 is decoupled and separated at any position for removal of the semiconductor wafer W on the loading tray 16. The tray stack supporters 34 are separated to allow semiconductor wafers W to be inserted and removed from the tray stack 12 housed in the external container 13. As a result, the thin plate container can be used in an existing manufacturing line of an automated factory without modification.

The transfer arm of the transfer robot grips the grip mechanism 36 to lift and transfer the external container 13, so that the thin plate container can be used in the automated factory without modification.

The lid 32 is guided by the door guides 67 and then fitted onto the container body 31, as well as being supported and properly aligned with respect to the container body 31, so that the lid 32 can be easily and accurately fitted onto the container body 31 and also supported stably against external vibration or shock without misalignment of the lid 32. As a result, the semiconductor wafers W are protected, and the loss of airtightness due to the misalignment of the lid 32 can be prevented.

The handles are provided on the external container 13, so that a worker can easily lift and carry the external container 13. Also, adherence of dust on the external container 13 due to static charge can be prevented, so that the semiconductor wafers W can be kept clean. Further, adherence of dust on the loading trays 16 due to charging can be prevented, so that the semiconductor wafers W can be kept clean.

The external container 13 or the like is provided with a transparent window to enable the interior to be seen, so that instances where the worker carries an empty container or the like by mistake can be eliminated.

In the above-described embodiment, the two base trays 15 are provided above and below. However, only the lower or upper base tray need be provided. If the tray stack 12 is supported from below, the base tray 15 is provided on the lower side. On the other hand, if the tray stack 12 is supported from above, base trays 15 are provided above and below.

In the above-described embodiment, the fitting portions 21 are wedge-shaped, i.e., a V-shape; however, they may be formed in another shape such as a trapezoidal shape in cross-section.

The loading tray 16 and the external container 13 may be formed of different materials. For example, an ESD or electrically conductive material and a transparent material may be used in combination to prevent adherence of dust on surfaces of the semiconductor wafers W and, therefore, the semiconductor wafers W can be kept clean. Also, the loading tray 16 can be formed of various materials which function to keep the semiconductor wafers W clean.

The external container 13 may be provided with a breather valve or filter as necessary. If a change in atmospheric pressure is large upon transfer, the external container 13 is provided with a breather valve or filter.

The above-described embodiment is configured to doubly seal the tray stack 12 and external container 13; however, either one of them may be sealed. A seal for the tray stack 12 need not be provided in some cases.

The thin plate container 11 as described above can be used both for transfer and in factory.

In the above-described embodiment, the lid 32 is also provided with the tray stack retainer 35; however, a lower surface of the lid 32 may be concave to mate with the fitting portions 21.

The invention claimed is:

1. A thin plate container comprising:
 a tray stack for housing a thin plate in a space defined between adjacent loading trays, the tray stack including a plurality of removable loading trays stacked for coupling together;
 a pair of grips provided at both opposing ends of each of the loading trays of the tray stack for gripping by a processing arm of external apparatus;
 an external container for housing the tray stack, the external container comprising a bag-shaped container body having an opening at one end;
 a lid for covering the opening of the container body;
 a sealing material, provided between the lid and the container body, for airtightly isolating the interior of the container body from an external environment; and
 a pair of tray stack supporters, respectively provided on two opposing inner surfaces of the container body, for supporting the tray stack.

2. The thin plate container according to claim 1, wherein: the spaces defined between adjacent loading trays, respectively containing thin plates are sealed airtight.

3. The thin plate container according to claim 1, wherein: the tray stack comprises:
 coupling means adapted to adjacent loading trays; and
 a loading portion, provided on each of the loading trays, for loading the thin plate upon holding of a thin plate inserted between adjacent loading trays.

4. The thin plate container according to claim 3, wherein a sealing material for airtightly isolating, from an external environment, a thin plate housed on a loading portion in a space between adjacent loading trays or between a loading tray and a base tray coupled with each other, the sealing material being is provided around the loading portion.

5. The thin plate container according to claim 1, further comprising:
 tray stack retainers for holding the tray stack housed in the container body from a bottom side of the container body and from a bottom side of the lid to support the tray stack upon fitting of the lid onto the container body; and
 fitting portions, which mate with the tray stack retainers, provided at an end portion on the container body bottom surface side and at an end portion on the lid side of each of the loading trays.

6. The thin plate container according to claim 5, wherein the tray stack retainers and the fitting portions have concave portions and convex portions which mate with each other, and abutting surfaces of the concave portions and the convex portions are sloped to form a wedge shape.

7. The thin plate container according to claim 5, further comprising:
 a latch mechanism for pressing and holding the lid to the container body and for coupling the tray stack retainers and the fitting portions with each other with the lid being fitted onto the container body and the tray stack retainers and the fitting portions being fitted to each other.

8. The thin plate container according to claim 5, wherein the tray stack retainers are formed of an elastic body and elastically support the tray stack.

9. The thin plate container according to claim 5, wherein a space for inserting the processing arm of the external equipment and a space for allowing the tray stack supported by the processing arm to be lifted are provided between the tray stack and the container body, with the tray stack being housed in the container body and supported by the tray stack supporters.

10. The thin plate container according to claim 5, wherein the tray stack supporters for supporting the tray stack housed in the container body are slidably or rotatably supported, and spaces for inserting the processing arm of the external equipment are provided between the tray stack supporters and the tray stack with the tray stack supporters being separated.

11. The thin plate container according to claim 1, wherein the container body of the external container is provided with a grip for engagement by a transfer arm of a transfer robot.

12. The thin plate container according to claim 1, wherein a door guide, for guiding fitting of the lid to the container body and for supporting the lid so as to prevent the lid from being misaligned with respect to the container body, is provided between the container body of the external container and the lid.

13. The thin plate container according to claim 1, wherein the container body of the external container is provided with a pair of handles for lifting the external container.

14. The thin plate container according to claim 1, wherein a part or the whole of the external container is formed of an electrostatic discharge or electrically conductive material.

15. The thin plate container according to claim 1, wherein at least the loading tray of the tray stack is formed of an electrostatic discharge or electrically conductive material.

16. The thin plate container according to claim 1, wherein any one or both of the tray stack and the external container are formed with a transparent window.

17. A thin plate container comprising:

a tray stack including a plurality of removable loading trays coupled to each other in a stack, with adjacent loading trays defining a space there between for holding a thin plate;

one or more base trays having a mechanical interface for engagement of the tray stack by an external apparatus, one or more of the loading trays being coupled with one surface of a base tray and a remainder of the plurality of loading trays being inserted between the base trays;

coupling means adapted to independently couple and decouple the loading trays or a base tray and a loading tray; and a loading portion, provided on each of the loading trays, for loading the thin plate between adjacent loading trays or between a loading tray and a base tray.

* * * * *

UNITED STATES PATENT AND TRADEMARK OFFICE
CERTIFICATE OF CORRECTION

PATENT NO.        : 7,922,000 B2
APPLICATION NO.   : 12/223027
DATED             : April 12, 2011
INVENTOR(S)       : Yukihiro Hyobu It is certified that error appears in the above-identified patent and that said Letters Patent is hereby corrected as shown below:

Col. 16, claim 3, line 12, change "coupling means adapted to adjacent loading trays; and" to --coupling means adapted to couple and decouple adjacent loading trays; and--

Col. 16, claim 4, line 21, delete "is" after being and before provided

Signed and Sealed this
Twenty-sixth Day of July, 2011

David J. Kappos
*Director of the United States Patent and Trademark Office*